US012772389B2

(12) United States Patent
Yoshimura

(10) Patent No.: US 12,772,389 B2
(45) Date of Patent: Oct. 20, 2026

(54) METHOD FOR MANUFACTURING WIRING BOARD OR WIRING BOARD MATERIAL

(71) Applicant: DAIWA CO., LTD., Nagano (JP)

(72) Inventor: Eiji Yoshimura, Okaya (JP)

(73) Assignee: DAIWA CO., LTD., Nagano (JP)

( * ) Notice: Subject to any disclaimer, the term of this patent is extended or adjusted under 35 U.S.C. 154(b) by 218 days.

(21) Appl. No.: 18/548,516

(22) PCT Filed: Sep. 9, 2022

(86) PCT No.: PCT/JP2022/033937
§ 371 (c)(1),
(2) Date: Aug. 31, 2023

(87) PCT Pub. No.: WO2023/127202
PCT Pub. Date: Jul. 6, 2023

(65) Prior Publication Data
US 2024/0147633 A1 May 2, 2024

(30) Foreign Application Priority Data
Dec. 27, 2021 (JP) ................................ 2021-212368

(51) Int. Cl.
*H05K 3/46* (2006.01)
*H05K 1/03* (2006.01)
*H05K 1/185* (2026.01)

(52) U.S. Cl.
CPC ........... *H05K 3/4644* (2013.01); *H05K 1/185* (2013.01); *H05K 1/0366* (2013.01); *H05K 2203/068* (2013.01)

(58) Field of Classification Search
CPC .... H05K 3/4644; H05K 1/185; H05K 1/0366; H05K 2203/068; H05K 2201/086;
(Continued)

(56) References Cited

U.S. PATENT DOCUMENTS

2002/0023342 A1* 2/2002 Nakamura ............. H05K 3/341 361/764
2005/0017740 A1 1/2005 Higashitani et al.
(Continued)

FOREIGN PATENT DOCUMENTS

EP 4 067 065 A1 10/2022
JP 2009-170493 A 7/2009
(Continued)

OTHER PUBLICATIONS

International Search Report issued in PCT/JP2022/033937; mailed Nov. 29, 2022.
(Continued)

*Primary Examiner* — George R Koch
*Assistant Examiner* — Christopher C Caillouet
(74) *Attorney, Agent, or Firm* — Studebaker Brackett PLLC

(57) ABSTRACT

A method for manufacturing a wiring board or a wiring board material includes: obtaining a laminated body LB including the wiring board or the wiring board material having an opening, an embedded member 14 positioned inside the opening, and a cured product of a filling sheet or a coating layer that is integrated with the wiring board or the wiring board material and contains a thermosetting resin 17, the thermosetting resin 17 being filled between an inner surface of the opening of the wiring board or the wiring board material and the embedded member; and removing the cured product of the filling sheet or the coating layer by grinding to obtain a constant thickness of the laminated body.

11 Claims, 12 Drawing Sheets

(58) Field of Classification Search
CPC ....... H05K 1/0204; H05K 2201/10416; H05K 2203/0156; H05K 2203/025; H05K 2203/0278; H05K 2203/0292; H05K 2203/1383; H05K 1/0203; H05K 3/4697; H05K 2201/10015; H05K 2201/10022
See application file for complete search history.

(56) References Cited

U.S. PATENT DOCUMENTS

| | | | |
|---|---|---|---|
| 2017/0086293 | A1 | 3/2017 | Cheng |
| 2019/0306988 | A1 | 10/2019 | Grober et al. |
| 2021/0195755 | A1 | 6/2021 | Yoshimura |

FOREIGN PATENT DOCUMENTS

| | | | |
|---|---|---|---|
| JP | 2015-202674 | A | 11/2015 |
| JP | 2017-059804 | A | 3/2017 |
| JP | 2017-201679 | A | 11/2017 |
| KR | 10-2018-0116349 | A | 10/2018 |
| TW | 202100352 | A | 1/2021 |
| TW | 202134029 | A | 9/2021 |
| WO | 2003/071603 | A1 | 8/2003 |
| WO | 2017/145936 | A1 | 8/2017 |

OTHER PUBLICATIONS

Notification of Transmittal of Translation of the International Preliminary Report on Patentability and Translation of Written Opinion of the International Searching Authority; PCT/JP2022/033937; mailed on Jul. 11, 2024.

An Office Action mailed by the Korean Intellectual Property Office on Jun. 9, 2025, which corresponds to Korean Patent Application No. 10-2024-7012406 and is related to U.S. Appl. No. 18/548,516; with English language translation.

* cited by examiner

METHOD FOR MANUFACTURING WIRING BOARD OR WIRING BOARD MATERIAL

TECHNICAL FIELD

The present invention relates to a method for manufacturing a wiring board or a wiring board material in which an embedded member such as a metal or an electronic component is embedded in the wiring board or the wiring board material.

BACKGROUND ART

There has been known a method for dissipating heat from the back face of a wiring board in order to suitably cool heat-generating components such as electronic components (such as LED and QFN (Quad For Non-Lead Package)) mounted on the wiring board. For example, there has been known a heat dissipation structure in which a metal plate (heat dissipation terminal) provided on the lower surface of a heat-generating component is soldered to a land of a mounting surface of a wiring board, to dissipate heat to the back face side of the wiring board through the land and a plated through hole. In order to further improve heat dissipation properties to the back face side, there has been known a method for soldering a heat dissipating terminal of a heat-generating component on coin-like copper (copper inlay) employed in place of a plated through hole.

As a technique related to a wiring board including such a copper inlay, a wiring board disclosed in the following patent document 1 has been known. On the wiring board, a heat-transfer member is press-fitted into a portion on which a heat-generating component is mounted, and a large diameter portion is formed on the press-fit side peripheral edge of a fit hole into which the heat-transfer member is fitted. The heat-transfer member includes a flange portion engaging with the large diameter portion in the press-fitted state. As a result, the fitting depth of the heat-transfer member can be easily kept constant without strictly managing the press-fitting force of the heat-transfer member with respect to the fit hole, whereby the press-fitting accuracy of the heat-transfer member and the press-fitting workability are improved.

However, in the structure of the board described in Patent Document 1, the structure of a portion into which the copper inlay is inserted becomes complicated, which disadvantageously causes high accuracy required for alignment, and a complicated insertion process.

As a method for solving such a problem, Patent Document 2 discloses a method for manufacturing a wiring board or a wiring board material including the steps of: preparing a laminated material including a wiring board material having an opening, a columnar metal body positioned inside the opening, a resin film attached to the wiring board material and having an opening, and a prepreg containing a thermosetting resin, integrating the laminated material by heating and pressing to obtain a laminated body including the thermosetting resin filled between an inner surface of the opening of the wiring board material and the columnar metal body, peeling at least the resin film from the laminated body, and removing a cured product of the thermosetting resin covering the columnar metal body of the laminated body.

PRIOR ART DOCUMENTS

Patent Document

Patent Document 1: JP-A-2009-170493
Patent Document 2: JP-A-2017-201679

SUMMARY OF THE INVENTION

Problems to be Solved by the Invention

However, in the manufacturing method described in Patent Document 2, when the resin film is peeled off from the integrated laminated body, the cured thermosetting resin filled between the inner surface of the opening and the columnar metal body is integrated with the cured prepreg, and therefore the filled thermosetting resin may be broken or missing. Such breakage and missing and the like cannot be repaired even if the cured product of the thermosetting resin covering the columnar metal body is ground, and thus there is a problem that the reliability and smoothness of the filling structure are deteriorated.

The problem that the reliability and smoothness of the filling structure are deteriorated as described above is not limited to the case of embedding the columnar metal body in the wiring board or the like, and is also a problem that occurs in the case of embedding various embedded members in the wiring board or the like.

Therefore, an object of the present invention is to provide a method for manufacturing a wiring board or a wiring board material, which does not require a complicated process when disposing an embedded member, can cope with embedded members having various shapes, and has high reliability and surface smoothness of the filling structure of the embedded member.

Means for Solving the Problems

The above object of the present invention can be achieved by the present invention as follows. That is, a method for manufacturing a wiring board or a wiring board material of the present invention includes the steps of: obtaining a laminated body including the wiring board or the wiring board material having an opening, an embedded member positioned in the opening, and a cured product of a filling sheet or a coating layer that is integrated with the wiring board or the wiring board material and contains a thermosetting resin, the thermosetting resin being filled between an inner surface of the opening of the wiring board or the wiring board material and the embedded member; and removing the cured product of the filling sheet or the coating layer by grinding to obtain a constant thickness of the laminated body.

The present invention uses the laminated body having a structure in which the embedded member is disposed in the opening of the wiring board or the wiring board material and the thermosetting resin is filled in the opening by heating and pressing, and therefore the present invention does not require a complicated process when disposing the embedded member and can cope with embedded members having various shapes. The cured product of the filling sheet or the like is removed by grinding to obtain a constant thickness of the laminated body, and therefore thermosetting resin filled in the opening is not integrated with the cured product of the filling sheet or the like, and the thermosetting resin filled in the opening is less likely to be broken or missing when the cured product is peeled off. Therefore, the reliability and surface smoothness of the filling structure of the embedded member can be enhanced.

In the above, it is preferable that the step of obtaining the laminated body includes steps of: preparing a laminated material including the wiring board or the wiring board material, the embedded member, and the filling sheet; integrating the laminated material by heating and pressing to obtain the laminated body; and in the removing step of the method, the cured product of the filling sheet is removed by grinding to obtain a constant thickness of the laminated body.

In this case, the embedded member can be disposed in the opening of the wiring board or the wiring board material, and the opening can be filled with the thermosetting resin contained in the filling sheet by heating and pressing, and therefore the laminated body can be obtained by a dry process. At that time, the method does not require a complicated process when disposing the embedded member, and can cope with embedded members having various shapes. The cured product of the filling sheet or the like is removed by grinding to obtain a constant thickness of the laminated body, and therefore thermosetting resin filled in the opening is not integrated with the cured product of the filling sheet or the like, and the thermosetting resin filled in the opening is less likely to be broken or missing when the cured product is peeled off. Therefore, the reliability and surface smoothness of the filling structure of the embedded member can be enhanced.

It is preferable that the laminated body includes a resin film having an opening at a position corresponding to the opening of the wiring board or the wiring board material, the resin film is attached to the wiring board or the wiring board material, and in the aforementioned step of removing the cured product of the filling sheet or the coating layer, a part of the resin film is removed, the aforementioned method further comprises the steps of: peeling the remaining part of the resin film from the laminated body; and removing the cured product of the thermosetting resin covering the embedded member of the laminated body.

By attaching the resin film to the wiring board or the wiring board material, the thermosetting resin is less likely to be attached to the surface of the wiring board or the like at the time of filling. The resin film is interposed between the cured product of the filling sheet or the like and the wiring board or the like, and the cured product is ground to the thickness at which a part of the resin film is removed, and therefore the cured product can be more reliably removed. In addition, when the remaining part of the resin film is peeled off from the laminated body, the height of the thermosetting resin positioned in the opening of the resin film is reduced, and the convex thermosetting resin can be more easily removed.

It is preferable that the laminated body includes a support film which is attached to a lower surface of the wiring board or the wiring board material, and the method further comprises peeling the support film from the laminated body.

By attaching the support film to the lower surface of the wiring board or the like, the thermosetting resin filled in the opening is less likely to be attached to the lower surface of the wiring board or the like, and therefore the lower surface of the opening can be flatly formed only by peeling the support film from the laminated body.

It is preferable that the filling sheet is a prepreg containing the thermosetting resin and a reinforcing fiber. The prepreg to be used is less likely to be deformed even if the surface of the wiring board or the wiring board material has irregularities. When the thermosetting resin is filled in the opening, the prepreg is less likely to be affected by the irregularities, and can be more reliably filled with the thermosetting resin.

It is preferable that the embedded member is disposed in the opening of the wiring board or the wiring board material by applying vibration in the step of obtaining the laminated body. According to this method, the embedded member can be efficiently disposed inside the opening in a short time.

The present invention can cope with embedded members having various shapes, and therefore various embedded members can be assumed, but the embedded member is preferably one or more selected from metal, ferrite, ceramic, a resistor, and a capacitor.

MODE FOR CARRYING OUT THE INVENTION

Embodiments of the present invention will be described below with reference to the drawings.

Figure 1A:
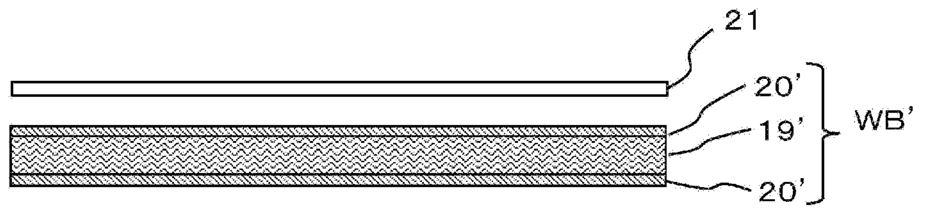
FIG. 1A is a cross-sectional view showing the process in an example of an embodiment of the present invention.
Figure 1B:
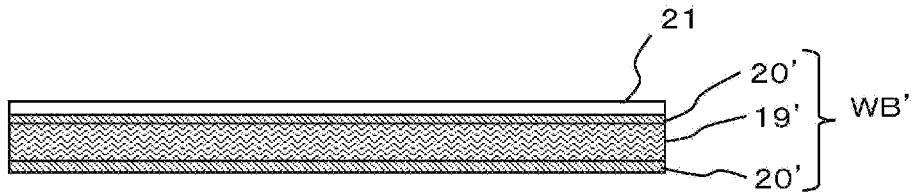
FIG. 1B is a cross-sectional view showing the process in an example of an embodiment of the present invention.
Figure 1C:
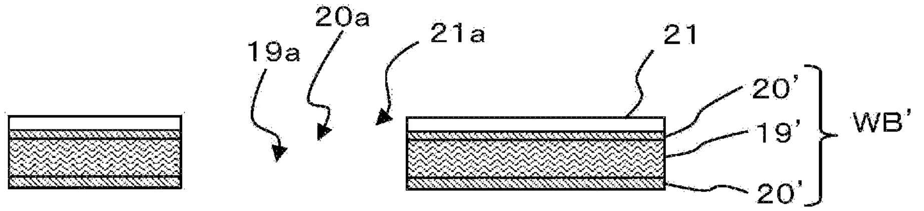
FIG. 1C is a cross-sectional view showing the process in an example of an embodiment of the present invention.
Figure 1D:
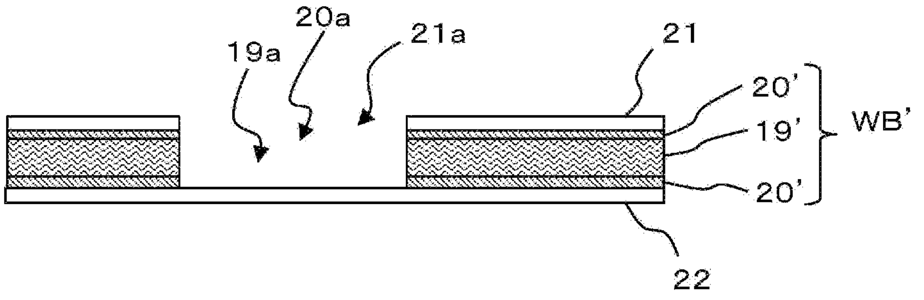
FIG. 1D is a cross-sectional view showing the process in an example of an embodiment of the present invention.
Figure 1E:
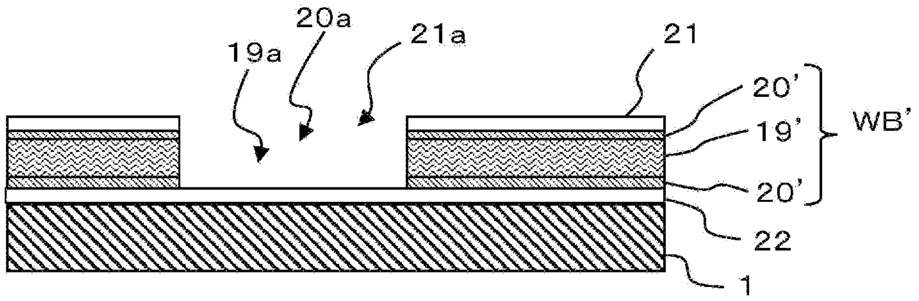
FIG. 1E is a cross-sectional view showing the process in an example of an embodiment of the present invention.
Figure 1F:
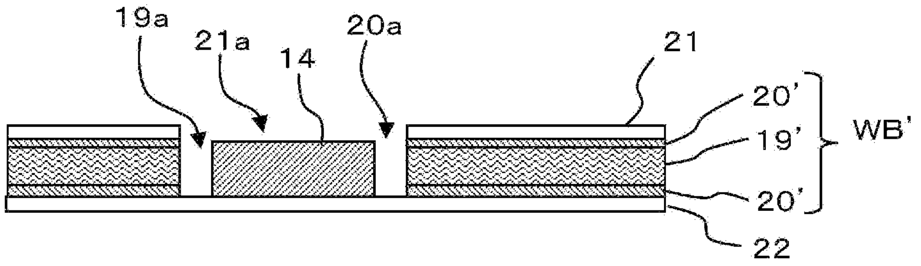
FIG. 1F is a cross-sectional view showing the process in an example of an embodiment of the present invention.
Figure 1G:
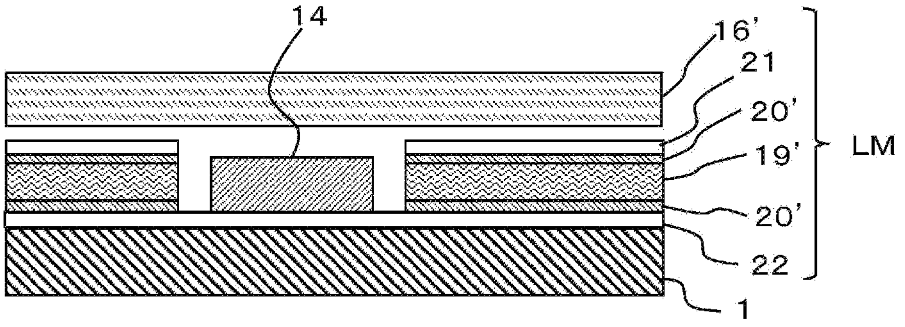
FIG. 1G is a cross-sectional view showing the process in an example of an embodiment of the present invention.
Figure 1H:
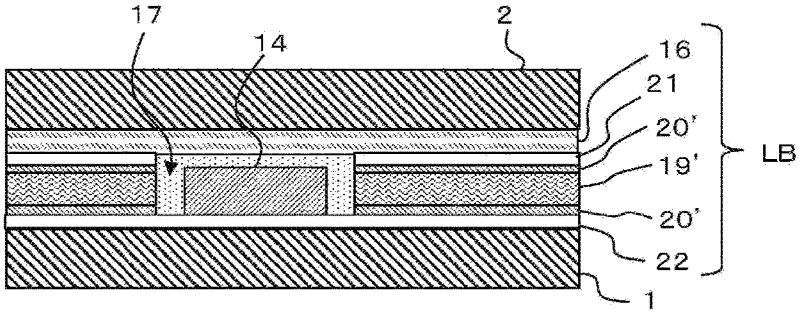
FIG. 1H is a cross-sectional view showing the process in an example of an embodiment of the present invention.
Figure 1I:
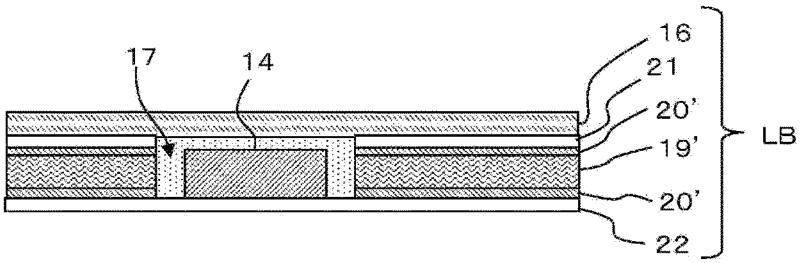
FIG. 1I is a cross-sectional view showing the process in an example of an embodiment of the present invention.

A method for manufacturing a wiring board or a wiring board material of the present invention includes, for example, as shown in FIG. 1I, the step of obtaining a laminated body LB including a wiring board WB or a wiring board material WB' having an opening, an embedded member 14 positioned in the opening, and a cured product 16 of a filling sheet 16' or a coating layer that is integrated with the wiring board WB or the wiring board material WB' and contains a thermosetting resin 17, wherein the thermosetting resin 17 is filled between an inner surface of the opening of the wiring board WB or the wiring board material WB' and the embedded member 14.

In the present embodiment, for example, as shown in FIGS. 1A to 1G, shown is an example including the step of preparing a laminated material LM including a wiring board WB or a wiring board material WB' having an opening, an embedded member 14 positioned inside the opening, and a filling sheet 16' that is laminated on the wiring board WB or the wiring board material WB' and contains a thermosetting resin 17.

In the present embodiment, first, as shown in FIG. 1A, an example is shown, in which a double-sided metal clad laminated board is used as the wiring board material WB', and a resin film 21 is attached to the side on which the filling sheet 16' of the wiring board material WB' is laminated.

The double-sided metal clad laminated board as the wiring board material WB' is obtained by bonding a cured insulating layer 19' to metal layer 20' on both sides, but a double-sided metal clad laminated board having a semi-cured insulating layer 19' may be cured at any stage. It is also possible to laminate two single-sided metal-clad laminated boards in which the semi-cured insulating layer 19' is bonded to the metal layers 20' in a state where the insulating layers 19' face each other. Furthermore, two metal plates (metal layers 20') may be laminated on both sides of the semi-cured insulating layer 19'. The wiring board WB may include the patterned metal layer 20' formed on the surface of the insulating layer 19'.

As the material of the semi-cured insulating layer 19', a material containing a thermosetting resin is preferable, and a prepreg containing a thermosetting resin and a reinforcing fiber is preferable. The thermosetting resin may be any material as long as the thermosetting resin is cured by heating or the like and has heat resistance required for the wiring board. Specific examples of the thermosetting resin include various thermosetting resins such as an epoxy resin, a phenol resin, and a polyimide resin.

The prepreg may be any material as long as the prepreg contains a thermosetting resin, is cured by heating or the like, and has heat resistance required for the wiring board. Specific examples thereof include composites of various thermosetting resins such as an epoxy resin, a phenol resin, and a polyimide resin, and reinforcing fibers such as a glass fiber, a ceramic fiber, an aramid fiber, and paper.

As the metal layer 20', any metal may be used, such as copper, a copper alloy, aluminum, stainless steel, nickel, iron, and other alloys. Among them, copper and aluminum are preferable from the viewpoints of thermal conductivity and electric conductivity.

As shown in FIG. 1B, the resin film 21 may only be disposed on the wiring board WB or the wiring board material WB'. However, it is preferable that the resin film 21 is pasted on the wiring board WB or the wiring board material WB' from the viewpoint of preventing the positional displacement of the resin film 21 and preventing the thermosetting resin 17 from being attached to the surface of the wiring board WB or the wiring board material WB'.

In the present invention, as shown in FIG. 1C, it is preferable to simultaneously form the openings 19*a* and 20*a* and the opening 21*a* in a state where the resin film 21 is pasted on the wiring board WB or the wiring board material WB', but it is also possible to separately form the openings 19*a* and 20*a* and the opening 21*a*.

As the resin film 21, a resin film is preferable, and any of polyesters, such as polyethylene terephthalate, polyolefins, such as polyethylene and polypropylene, and polyamides and the like can also be used. However, polyesters, such as polyethylene terephthalate, are preferable from the viewpoint of heat resistance.

When the resin film 21 is pasted, it is preferable to provide a pressure sensitive adhesive layer on the resin film 21. As the pressure sensitive adhesive, a rubber-based pressure sensitive adhesive, an acrylic pressure sensitive adhesive, and a silicone-based pressure sensitive adhesive and the like can be used. Instead of providing the pressure sensitive adhesive layer on the resin film 21, the pressure sensitive adhesive layer can be separately applied to the wiring board WB or the wiring board material WB'.

As shown in FIG. 1C, the wiring board WB or the wiring board material WB' has the openings 19*a* and 20*a* in portions corresponding to the embedded members 14, but the wiring board WB or the wiring board material WB' usually has a plurality of openings 19*a* and 20*a*. The openings 19*a* and 20*a* can be formed by a drill, a punch, or a router or the like. The openings 19*a* and 20*a* are preferably slightly larger than the top surface of the embedded member 14.

As the shapes of the openings 19*a* and 20*a*, any shape such as a circular shape, an elliptical shape, a quadrangular shape, or a shape corresponding to the outer shape of the embedded member 14 can be employed. Even in the case of a quadrangle or a complicated shape, it is possible to form the openings 19*a* and 20*a* having a complicated shape by using a router or the like.

In the present embodiment, an example is shown, in which a support film 22 is attached to the lower surface of the wiring board WB or the wiring board material WB' as shown in FIG. 1D. As the support film 22, the same resin film as the resin film 21 can be used, and the support film 22 preferably has the same pressure sensitive adhesive layer.

Subsequently, as shown in FIGS. 1E to 1F, the embedded member 14 is disposed in the opening of the wiring board WB or the wiring board material WB' by placing the wiring board WB or the wiring board material WB' on a support table 1 or the like. In the present embodiment, an example is shown, in which the embedded member 14 having the same thickness as that of the wiring board WB or the wiring board material WB' is used.

The embedded member 14 only needs to be disposed inside the opening of the wiring board WB or the wiring board material WB', and even when the thickness of the embedded member 14 exceeds the thickness of the wiring board WB or the wiring board material WB', the surface can be flattened by cutting the embedded member 14 later. However, from the viewpoint of eliminating such cutting, the thickness of the embedded member 14 preferably is the same as or less than that of the wiring board WB or the wiring board material WB'.

When the embedded member 14 has a thickness smaller than that of the wiring board WB or the wiring board material WB', the top surface of the embedded member 14 can be exposed by removing the thermosetting resin 17 covering the top surface of the embedded member 14 as necessary.

Examples of the embedded member 14 include one or more selected from functional members such as metal, ferrite, and ceramic, and small electronic components (chip components) such as a resistor and a capacitor. Examples of the planar shape of the embedded member 14 include a circular shape, an elliptical shape, a quadrangular shape, and other shapes similarly to the opening. The small electronic component preferably has an electrode on one of both surfaces or each of the surfaces in a thickness direction, and therefore electrical connection due to a wiring pattern can be provided by exposing the electrode of the small electronic component.

When the size of the embedded member 14 in a lateral direction is too large, the embedded member 14 is apt to fall off after filling, and when the size is too small, it is difficult to dispose the embedded member 14. Therefore, the width of the embedded member is preferably 0.1 to 20 mm at the widest portion.

As a method for disposing the embedded member 14, a method for using a mounting device or the like for surface-mounting a microscopic component on a wiring board, or a method for laminating and disposing the embedded member 14 collectively formed at the position of the opening by etching or the like in advance on a support as described later, on the wiring board WB or the wiring board material WB' can also be used, but a method for disposing the embedded member 14 in the opening by applying vibration is preferable. As such a device, a commercially available transfer device used for surface-mounting the microscopic component on the wiring board can be used.

Examples of the method for applying vibration include a method for continuously disposing the embedded member 14 in the opening while applying vibration to the wiring board WB or the wiring board material WB' and conveying the embedded member on the surface thereof, similarly to the conveyance of the microscopic component by a vibration feeder. A large number of embedded members 14 may be supplied to the top surface of the wiring board WB or the wiring board material WB' in a batch manner, followed by applying vibration to the wiring board WB or the wiring board material WB' and/or the embedded member 14, and removing the embedded member 14 present other than the opening.

The frequency and amplitude of the vibration can be appropriately set according to the size of the embedded member 14 and the like, but for example, the frequency is preferably 100 to 10000 Hz, and the amplitude is preferably 10 μm to 1000 μm. Such a minute vibration generator can be constituted by, for example, a vibrator using an electromagnet and an iron piece, or an electroacoustic transducer such as a piezoelectric transducer or a ferrite vibrator.

As shown in FIG. 1F, a method for using a mounting device or the like to dispose the embedded member 14 inside the opening without bias (preferably at the central position) is preferable. However, even in the vibration imparting method, the embedded member 14 can be disposed inside the opening without bias by disposing a jig provided with a smaller opening at the central position of the opening or in the vicinity thereof on the upper side of the wiring board WB or the wiring board material WB'.

Subsequently, as shown in FIG. 1G, the filling sheet 16' containing the thermosetting resin 17 is laminated and disposed on the wiring board WB or the wiring board material WB' having an opening and the embedded member 14 positioned in the opening on the support table 1, to obtain a laminated material LM containing these.

Regarding the thickness of each layer, for example, the thickness of the wiring board WB or the wiring board material WB' is 100 to 3000 μm, the thickness of the embedded member 14 is 100 to 3000 μm, the thicknesses of the resin film 21 and the support film 22 are 30 to 1000 μm, and the thickness of the filling sheet 16' is 60 to 300 μm.

The filling sheet 16' may be any sheet as long as the filling sheet 16' contains the thermosetting resin 17, and may be a sheet made of a thermosetting resin, but is preferably a prepreg containing the thermosetting resin 17 and a reinforcing fiber. The thermosetting resin 17 may be any material as long as the thermosetting resin 17 is deformed during heating and pressing to be cured by heating and the like, and has heat resistance required for the wiring board. Specific examples of the thermosetting resin 17 include various thermosetting resins such as an epoxy resin, a phenol resin, and a polyimide resin.

The prepreg may be any material as long as the prepreg contains the thermosetting resin 17, is deformed during heating and pressing to be solidified by heating and the like, and has heat resistance required for the wiring board. Specific examples thereof include composites of various thermosetting resins such as an epoxy resin, a phenol resin, and a polyimide resin, and reinforcing fibers such as a glass fiber, a ceramic fiber, an aramid fiber, and paper.

It is preferable that the filling sheet 16' is made of a material having high thermal conductivity, and examples thereof include a resin containing a thermally conductive filler.

It is preferable that a resin constituting the filling sheet 16' has an excellent adhesive force to the embedded member 14, and does not impair withstand voltage characteristics and the like. As such a resin, in addition to the epoxy resin, the phenol resin, and the polyimide resin, various engineering plastics can be used singly or in combination of two or more. Among them, the epoxy resin provides an excellent joining force between metals, which is preferable. In particular, among the epoxy resin, a bisphenol A type epoxy resin, a bisphenol F type epoxy resin, a hydrogenated bisphenol A type epoxy resin, a hydrogenated bisphenol F type epoxy resin, a triblock polymer having a bisphenol A type epoxy resin structure at both terminals, and a triblock polymer having a bisphenol F type epoxy resin structure at both terminals which have high flowability and excellent mixing properties with metal oxides and metal nitrides are more preferable resins.

In the present embodiment, as shown in FIGS. 1H to 1I, an example is shown, including the step of integrating the laminated material LM by heating and pressing to obtain a laminated body LB in which the thermosetting resin 17 is filled between an inner surface of the opening of the wiring board WB or the wiring board material WB' and the embedded member 14. In the illustrated example, this makes it possible to form the laminated body LB in which the height of the embedded member 14 is the same as that of the surface of the wiring board WB or the wiring board material WB'.

As shown in FIG. 1I, the filling sheet 16' becomes a thinner cured product 16 by heating and pressing. The thermosetting resin 17 is filled between the inner surface of the opening of the wiring board WB or the wiring board material WB' and the embedded member 14, and the top surface of the embedded member 14 is covered with the thermosetting resin 17 of the filling sheet 16'.

As the heating and pressing, a method for disposing the laminated material LM on the support table 1 and heat-pressing the laminated material LM with a press plate 2 or the like can be employed.

The hot press method may be performed by using a hot press device (heat laminator, hot press) and the like. At that time, the hot press method may be performed in a vacuum atmosphere (vacuum laminator and the like) in order to avoid the mixing of air. In particular, when the support film 22 is pasted to the lower surface, there is no place for air to escape inside the opening, and therefore it is preferable to perform heating and pressing in a reduced-pressure atmosphere.

Conditions such as a heating temperature and a pressure may be appropriately set according to the material and thickness of the filling sheet 16', but the pressure is preferably 0.5 to 30 MPa.

Figure 1J:
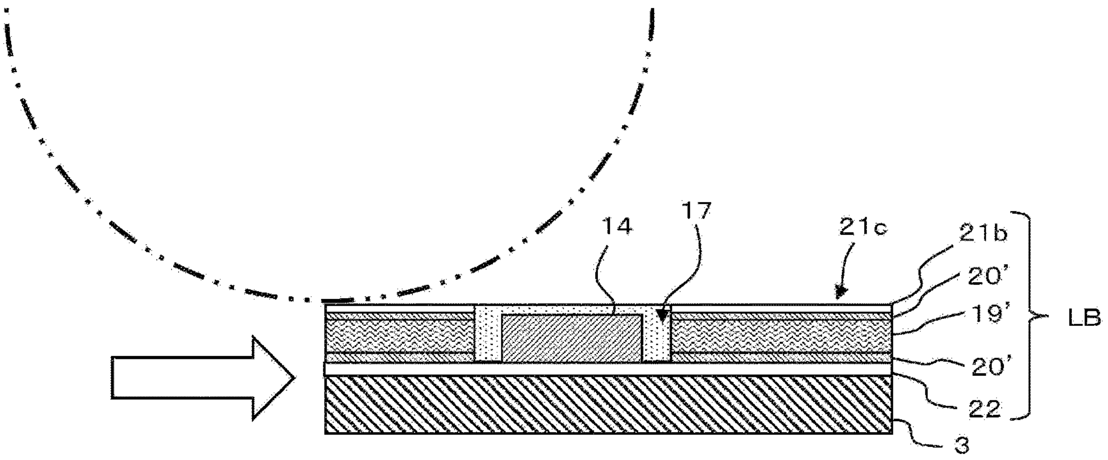
FIG. 1J is a cross-sectional view showing the process in an example of an embodiment of the present invention.

Subsequently, as shown in FIG. 1J, the present invention includes the step of removing the cured product 16 of the filling sheet 16' or the coating layer by grinding to obtain a constant thickness of the laminated body LB. In the present embodiment, an example is shown, in which, when the cured product 16 of the filling sheet 16' is removed, a part of the resin film 21 is removed. As a result, the entire cured product 16 is removed, and a part of the resin film 21 is removed. Of course, only the entire cured product 16 may be removed, or the entire cured product 16 and the entire resin film 21 may be removed.

As described above, a commercially available table movable belt sander can be used as a device for grinding the laminated body LB such that the thickness of the laminated body LB becomes constant. In FIG. 1J, a grinding belt supported on the surface of a rotating roll is indicated by an imaginary line, but actually, the grinding belt has a larger radius of curvature with respect to an object to be ground. The grinding belt moving together with the roll has a certain interval from a moving table 3. By allowing the laminated body LB to pass through the interval, the laminated body LB can be ground such that the thickness of the laminated body LB becomes constant.

As the table movable belt sander, for example, a belt sander including a sanding head having a grinding belt supported on the surface of a roll and a material feeding table that conveys an object to be ground while ensuring a constant interval with the grinding belt can be used.

Specifically, the table movable belt sander is configured as follows. For example, a contact drum type sanding head with very high grinding performance is employed. The contact drum is fully dynamically balanced, and held by a high-precision bearing. A gate-shaped frame housing the sanding head is held by four lifting jacks, and the frame can be lifted and lowered according to a change in the thickness of the object to be ground. The lifted amount is displayed by a digital display, and it is also possible to set a cutting amount and perform automatic operation.

The material feeding table can travel on precision LM guides attached to both sides of a bed to perform grinding, and the traveling speed can be steplessly converted by an inverter. The material feeding table is equipped with a suction device, and the object to be ground can be reliably fixed to the surface of the table. The traveling speed of the grinding belt can be steplessly converted by the inverter such that an appropriate grinding speed can be selected according to the material of the object to be ground.

A grinding belt air cleaner and a dust collecting hood for preventing clogging are attached near the contact drum, and the frame on the grinding belt insertion side also includes a door. A rotary panel brush is provided, and therefore the surface of a processing material can be cleaned after grinding to collect the attached grinding powder.

Figure 1K:
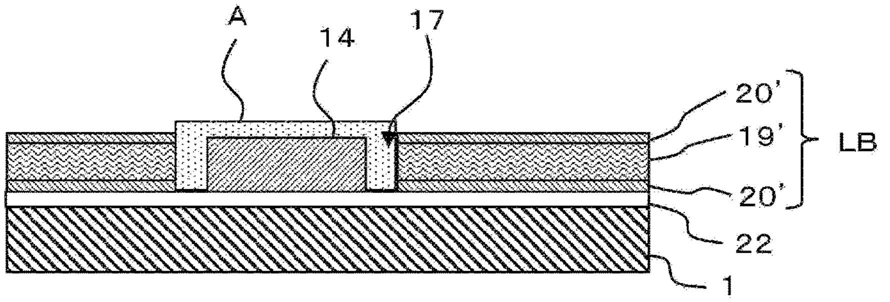
FIG. 1K is a cross-sectional view showing the process in an example of an embodiment of the present invention.

In the present embodiment, subsequently, as shown in FIG. 1K, the step of peeling the remaining portion 21*b* of the resin film 21 from the laminated body LB is included. As a result, the thermosetting resin 17 covering the embedded member 14 remains, and therefore a protrusion A made of the thermosetting resin 17 is formed.

Figure 1L:
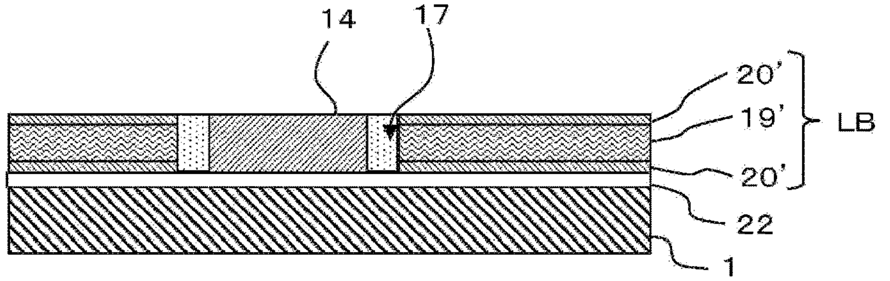
FIG. 1L is a cross-sectional view showing the process in an example of an embodiment of the present invention.

In the present embodiment, subsequently, as shown in FIG. 1L, the step of removing the cured product of the thermosetting resin 17 covering the embedded member 14 of the laminated body LB is included. As a result, the top surface of the laminated body LB can be flattened.

When the height of the embedded member 14 is the same as the height of the wiring board WB or the wiring board material WB', the protrusion A above the embedded member 14 is removed by this step, and therefore the top surface of the embedded member 14 can be exposed. That is, it is preferable that the protrusion A is removed and flattened such that the top surface of the metal layer 20' and the embedded member 14 have the same height.

In the present embodiment, the resin film 21 is removed prior to the removal of the protrusion A, but the resin film 21 can be removed at the same time when the protrusion A is removed.

A method for removing the convex portion A is preferably a method due to grinding or polishing, and examples thereof include a method for using a grinding device having a plurality of hard rotary blades made of diamond and the like and arranged in the radial direction of a rotating plate, and a method for using a sander, a belt sander, a grinder, a plane grinding machine, or a hard abrasive grain molded article and the like. When the grinding device is used, the top surface can be flattened by moving the hard rotary blades along the top surface of the fixedly supported wiring board while the hard rotary blades are rotated. Examples of the polishing method include a light polishing method using a belt sander and buff polishing and the like.

Figure 1M:
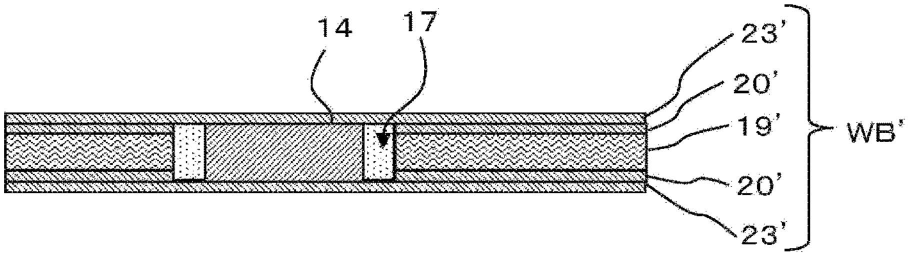
FIG. 1M is a cross-sectional view showing the process in an example of an embodiment of the present invention.

Subsequently, in the present embodiment, as shown in FIG. 1M, performed is the step of peeling off at least the support film 22 from the laminated body LB. This makes it possible to obtain the wiring board material WB' before pattern formation. When the support film 22 is peeled off, an adhesive force between the embedded member 14 and the support film 22 is set to be smaller than an adhesive force between the embedded member 14 and the thermosetting resin 17. With such an adhesive force, the support film 22 can be easily peeled off.

When the wiring board material WB' is laminated and integrated as in the present embodiment, the metal layer 20' is pattern-formed as necessary. Prior to this, as shown in FIG. 1M, the exposed embedded member 14 and metal layer 20' can be metal-plated to form a metal-plated layer 23'. This makes it possible to obtain a wiring board having a pattern portion extending on at least one surface of the embedded member 14. Metal species of the metal plating are preferably, for example, copper, silver, and Ni and the like. Examples of a method for forming the metal-plated layer 23' include a combination of an electroless plating method and electrolytic plating.

Figure 1N:
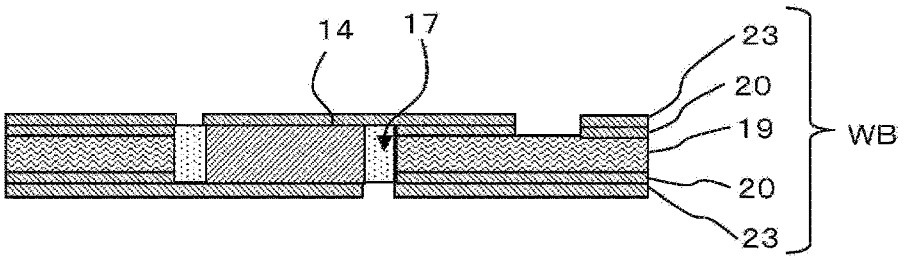
FIG. 1N is a cross-sectional view showing the process in an example of an embodiment of the present invention.

Subsequently, in the present embodiment, as shown in FIG. 1N, the metal-plated layer 23' and the metal layer 20' are pattern-formed to form a wiring layer 23. For example, in the pattern formation, the patterned wiring layer 23 can be formed by etching the metal-plated layer 23' and the metal layer 20' in a predetermined pattern using an etching resist.

The removal of the etching resist may be appropriately selected according to the type of the etching resist such as removal of a medical agent and peeling removal. For example, a photosensitive ink formed by screen printing is removed with a chemical such as alkali.

As described above, as shown in FIG. 1N, the wiring board WB can be obtained, which includes the embedded member 14 embedded in the wiring board WB, the wiring layer 23, and the insulating layer 19, the periphery of the embedded member 14 being bonded to the insulating layer 19 by the thermosetting resin 17. Such a wiring board WB can also be manufactured as an aggregate in which a plurality of wiring boards WB are formed in the same plane, and each wiring board WB can be finally cut out.

In the present invention, it is also possible to form an interlayer connection structure by providing a plated through hole or the like in the wiring board WB as shown in FIG. 1N. It is also possible to manufacture a multilayer wiring board having a larger number of layers by further forming a wiring layer and an insulating layer on one surface or each of both surfaces of the wiring board WB shown in FIG. 1N by a build-up process or the like.

When the embedded member 14 of the wiring board WB is a metal, ceramic or other material with high thermal conductivity, the wiring board WB is useful as a board for mounting a semiconductor element, and is particularly useful as a board for mounting a power semiconductor element and a light-emitting element. Here, the semiconductor element includes a semiconductor bare chip, a chip part, and a semiconductor package, and the power semiconductor element includes semiconductor elements such as various transistors used in an inverter device and a voltage conversion device and the like, and various diodes.

When the embedded member 14 is a magnetic body such as ferrite, a wiring board WB in which a coil component is formed together with a wiring layer can be provided. When the embedded member 14 is an electronic component such as a resistor or a capacitor, a wiring board WB incorporating these components can be provided.

Figure 2A:
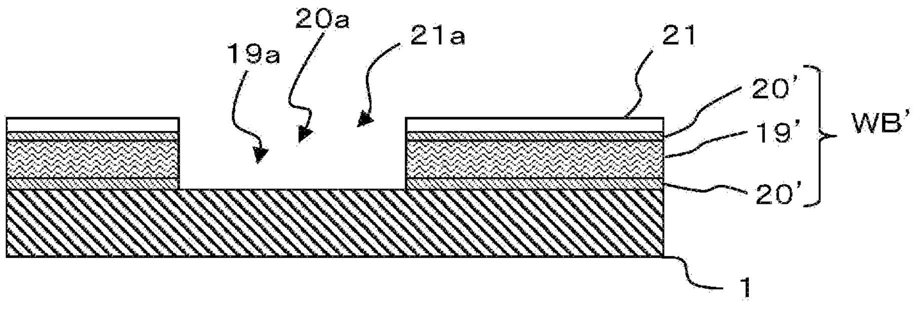
FIG. 2A is a cross-sectional view showing the process in another example of an embodiment of the invention.
Figure 2B:
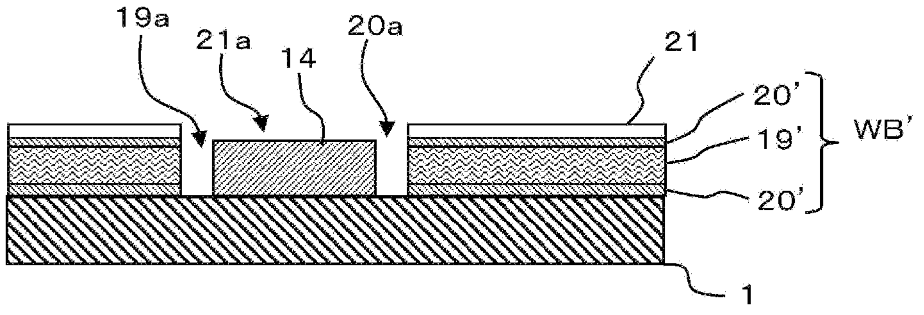
FIG. 2B is a cross-sectional view showing the process in another example of an embodiment of the invention.
Figure 2C:
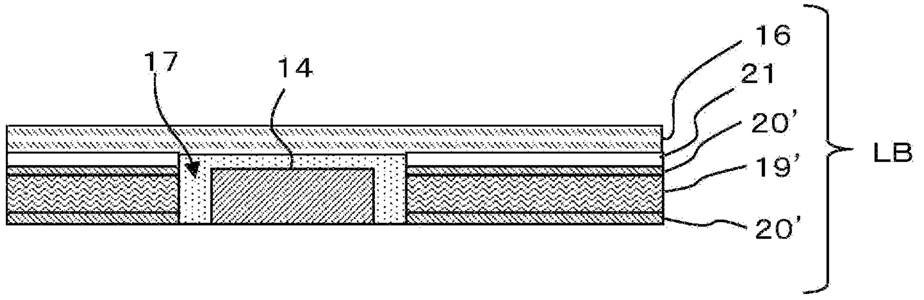
FIG. 2C is a cross-sectional view showing the process in another example of an embodiment of the invention.

Another Embodiment (1) In the above embodiment, an example has been shown, in which the step of attaching the support film to the lower surface of the wiring board or the wiring board material and further peeling the support film from the laminated body is included, but for example, as shown in FIGS. 2A to 2C, the present invention can be implemented using a support table 1 such as a mirror surface plate.

In the present embodiment, as shown in FIGS. 2A and 2B, in a state where a wiring board WB or a wiring board material WB' is placed on the support table 1 such as a mirror surface plate, an embedded member 14 is disposed in the opening of the wiring board WB or the wiring board material WB', and a filling sheet 16' containing a thermosetting resin 17 is further placed to prepare a laminated material LM containing them.

Subsequently, as shown in FIG. 2C, performed is the step of integrating the laminated material LM by heating and pressing to obtain a laminated body LB in which the thermosetting resin 17 is filled between the inner surface of each of openings 19*a* and 20*a* of the wiring board WB or the wiring board material WB' and the embedded member 14. At that time, the thermosetting resin 17 may be attached to the periphery of the opening of the lower surface of the wiring board WB or the wiring board material WB', but the attached thermosetting resin 17 can be removed by polishing or a chemical treatment.

Thereafter, in the same manner as in the above embodiment, the step of removing the cured product 16 of the filling sheet 16' by grinding to obtain a constant thickness of the laminated body LB can be performed.

In the same manner as in the above embodiment, when the laminated material LM is prepared, a resin film 21 having an opening at a position corresponding to the opening of the wiring board WB or the wiring board material WB' is attached to the side on which the filling sheet 16' of the wiring board WB or the wiring board material WB' is laminated. When the cured product 16 of the filling sheet 16' is removed, a part of the resin film 21 is removed, and further peeling the remaining portion 21*b* of the resin film 21 from the laminated body LB, and the step of removing the cured product of the thermosetting resin 17 covering the embedded member 14 of the laminated body LB can be performed.

Furthermore, in the same manner as in the above embodiment, a wiring board having a wiring layer can be obtained by forming or pattern-forming a metal-plated layer.

(2) In the above embodiment, an example is shown, in which the resin film having the opening at the position corresponding to the opening of the wiring board or the wiring board material is attached to the wiring board or the wiring board material, but for example, as shown in FIGS. 3A to 3E, the present invention can also be implemented without using the resin film having the opening.

Figure 3A:
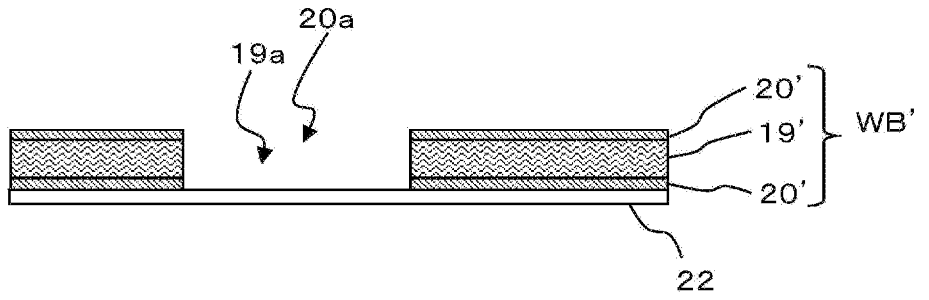
FIG. 3A is a cross-sectional view showing the process in another example of an embodiment of the invention.
Figure 3B:
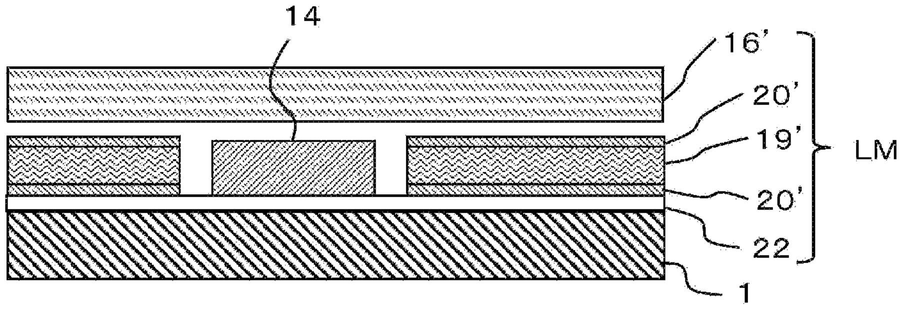
FIG. 3B is a cross-sectional view showing the process in another example of an embodiment of the invention.

In this case, for example, as shown in FIGS. 3A and 3B, prepared is a laminated material LM including a wiring board WB or a wiring board material WB' having an opening to which a resin film 21 is not attached, an embedded member 14 positioned in the opening, and a filling sheet 16' laminated on the wiring board WB or the wiring board material WB' and containing a thermosetting resin 17. In the present embodiment, an example is shown, in which a support film 22 is attached to the lower surface of the wiring board WB or the wiring board material WB'.

Figure 3C:
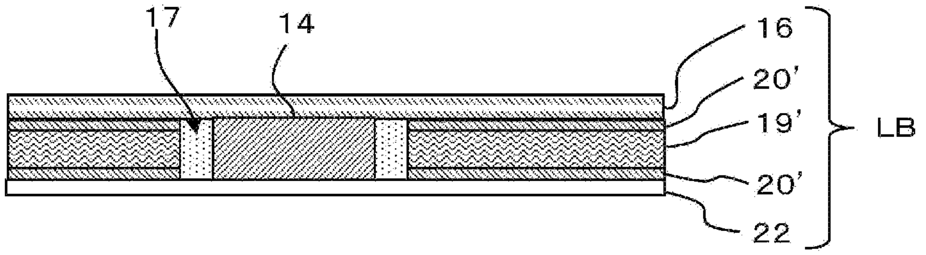
FIG. 3C is a cross-sectional view showing the process in another example of an embodiment of the invention.

Subsequently, for example, as shown in FIG. 3C, in the same manner as in the above embodiment, the laminated material LM is integrated by heating and pressing to obtain a laminated body LB in which the thermosetting resin 17 is filled between the inner surface of the opening of the wiring board WB or the wiring board material WB' and the embedded member 14. This makes it possible to form the laminated body LB in which the height of the embedded member 14 is the same as the height of the surface of the wiring board WB or the wiring board material WB'.

Figure 3D:
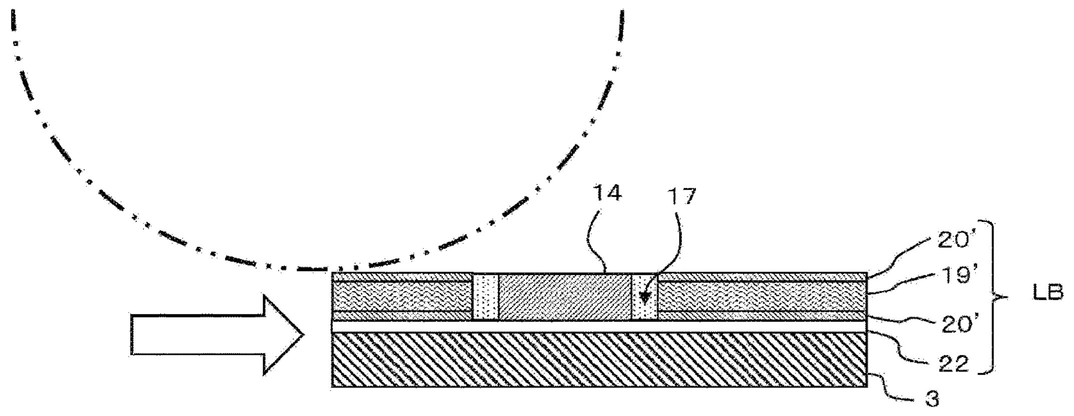
FIG. 3D is a cross-sectional view showing the process in another example of an embodiment of the invention.

Subsequently, as shown in FIG. 3D, the cured product 16 of the filling sheet 16' is removed by grinding to obtain a constant thickness of the laminated body LB. However, in the present embodiment, when the cured product 16 of the filling sheet 16' is removed, the thickness of the ground laminated body LB is set to a thickness at which the cured product 16 is entirely or almost entirely removed. As a result, the cured product 16 is entirely or almost entirely removed.

As a device for entirely or almost entirely removing the cured product 16 in this manner, a table movable belt sander can be used as in the above embodiment. In FIG. 3D, a grinding belt supported on the surface of a rotating roll is indicated by an imaginary line, but actually, the grinding belt has a larger radius of curvature with respect to an object to be ground. The grinding belt moving together with the roll has a certain interval from a moving table 3. By setting the interval to the same height as that of the surface of the wiring board WB or the wiring board material WB', and allowing the object to be ground to pass through the interval, the cured product 16 can be entirely or almost entirely ground and removed.

Figure 3E:
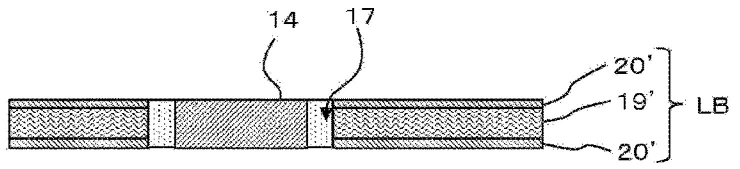
FIG. 3E is a cross-sectional view showing the process in another example of an embodiment of the invention.

As a result, the laminated body LB shown in FIG. 3E can be obtained. The laminated body LB is basically the same as the laminated body LB shown in FIG. 1L, and the subsequent steps can be performed in the same manner as in the above embodiment.

By setting the interval from the grinding belt to a height slightly lower than the surface of the wiring board WB or the wiring board material WB' and allowing the object to be ground to pass through the interval, the cured product 16 can be entirely ground and removed, and a part of the embedded member 14 and the metal layer 20' can also be ground and removed.

Also in this case, in the same manner as in the above embodiment, a metal-plated layer is formed or pattern-formed, and therefore a wiring board having a wiring layer can be obtained.

(3) In the above embodiment, an example is shown, in which, when the plurality of embedded members are disposed in the plurality of openings of the wiring board or the wiring board material, the independent embedded members are individually disposed. However, for example, as shown in FIGS. 4A to 4E, the plurality of embedded members 14 may be formed at positions corresponding to the openings of the wiring board WB or the wiring board material WB' on the top surface of the support film 22, and the wiring board WB or the wiring board material WB' may be laminated thereon.

Figure 4A:
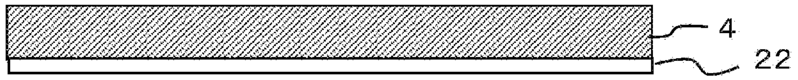
FIG. 4A is a cross-sectional view showing the process in another example of an embodiment of the invention.

In this case, for example, as shown in FIG. 4A, the plurality of embedded members 14 can be formed by etching or the like using the metal plate 4 to which the support film 22 is attached. As a method for forming the plurality of embedded members 14 by a method other than etching, a method for transferring the plurality of embedded members 14 from a transfer sheet on which the plurality of embedded members 14 are positioned in advance to the support film 22 to attach the embedded members 14 to the support film, or a method for sequentially attaching the individual embedded members 14 to the support film 22 using a mounting apparatus or the like can also be used. Examples of the embedded member 14 formed by a method other than etching include a metal pin and a metal plate manufactured by punching, molding, or the like.

Figure 4B:
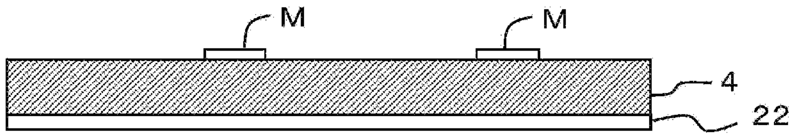
FIG. 4B is a cross-sectional view showing the process in another example of an embodiment of the invention.
Figure 4C:
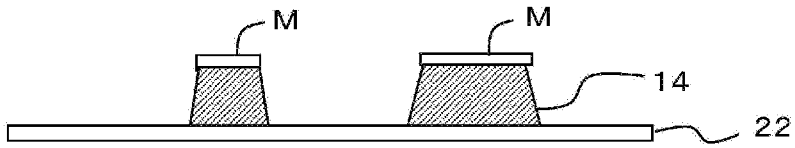
FIG. 4C is a cross-sectional view showing the process in another example of an embodiment of the invention.

As shown in FIGS. 4B and 4C, etching can also be performed by using an etching resist M only at the formation position of each of the embedded members 14. However, as shown in FIGS. 5A and 5B, it is preferable to perform etching using the etching resist M such that only the periphery of the formation position of each of the embedded members 14 is exposed.

Figure 5A:
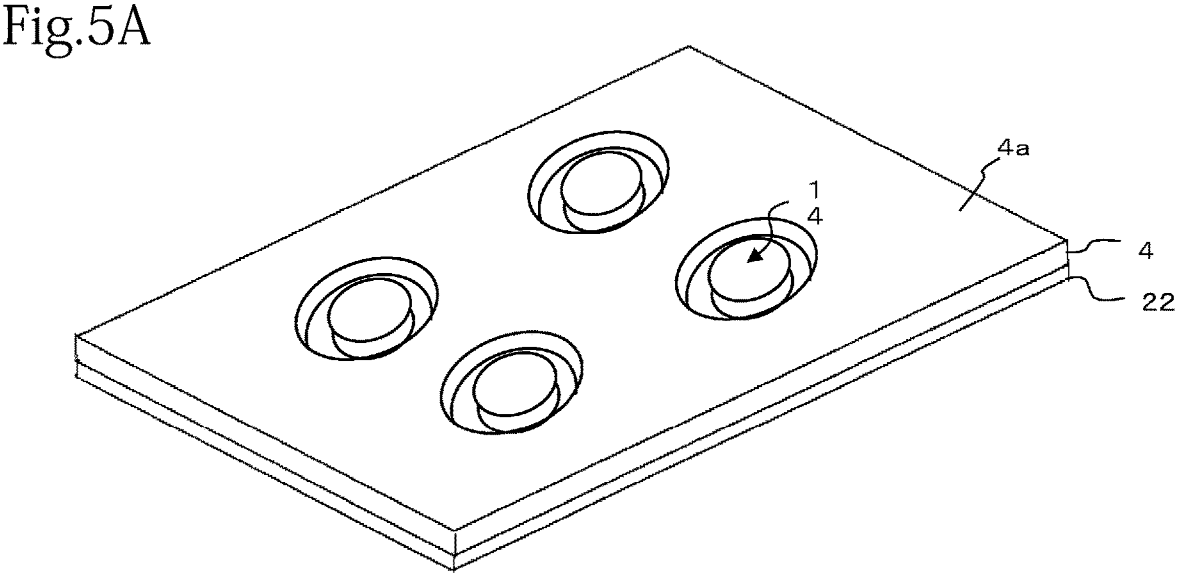
FIG. 5A is a cross-sectional view showing the process in another example of an embodiment of the invention.
Figure 5B:
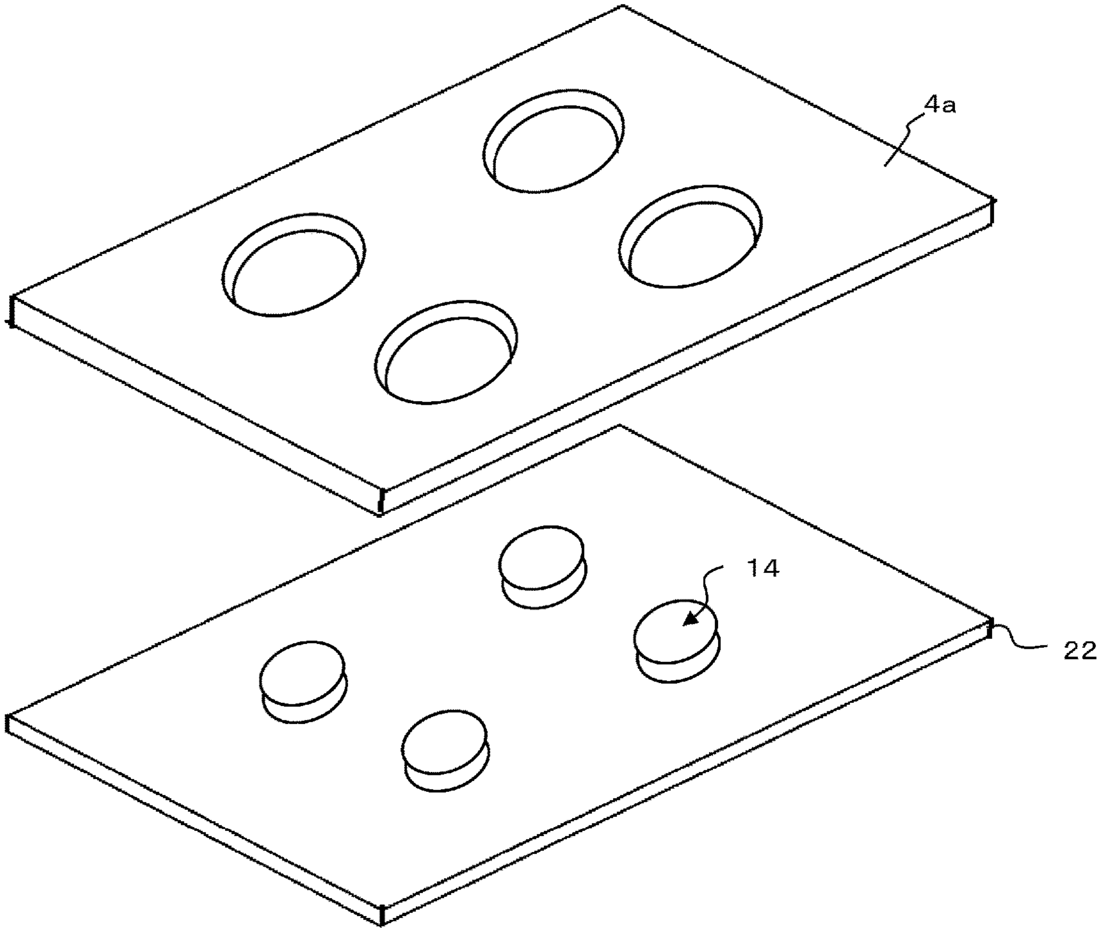
FIG. 5B is a cross-sectional view showing the process in another example of an embodiment of the invention.

That is, as shown in FIGS. 5A and 5B, only the periphery of the formation position of each of the embedded members 14 in the metal plate 4 is etched, and a remaining portion 4*a* of the metal plate 4 other than the embedded members 14 is then peeled, and therefore the plurality of embedded members 14 can be formed on the support film 22.

Thus, the method for performing etching using the etching resist M such that only the periphery of the formation position of each of the embedded members 14 is exposed can reduce the use amount of an etching solution, prevent degradation, and easily recycle the peeled metal plate 4.

The present invention preferably includes the step of chemically and/or physically surface-treating the embedded members 14 using the support film 22 having the embedded members 14 formed thereon. Examples of such a surface treatment include a chemical treatment called a blackening treatment and a physical treatment such as sandblasting.

The metal constituting the metal plate 4 may be any metal. For example, copper, a copper alloy, aluminum, stainless steel, nickel, iron, and other alloys and the like may be used. Among them, copper or a copper alloy is preferable from the viewpoints of thermal conductivity, and bonding properties of a solder.

Regarding the thickness of each of the layers, for example, the thickness of the support film 22 is 30 to 1000 μm, and the thickness of the metal plate 4 is 100 to 2000 μm.

Performed is the step of etching the metal plate 4 using such a laminated body to form the plurality of embedded members 14 on the support film 22. By etching, the embedded members 14 can be formed at positions where semiconductor elements and the like are mounted.

The metal plate 4 can be selectively etched by using the etching resist M. The size of each of the embedded members 14 can be made smaller than the size of the semiconductor element to be mounted. For example, each of the embedded members 14 has a top surface having a diameter of 0.3 to 10 mm. The shape of the top surface of each of the embedded members 14 may be any shape such as a quadrilateral shape or a circular shape.

As the etching resist M, a photosensitive resin and a dry film resist (photoresist) and the like can be used. Examples of an etching method include etching methods using various etching solutions according to the types of metals constituting the metal plate 4. For example, when the metal plate 4 is made of copper, a commercially available alkaline etching solution, ammonium persulfate, and hydrogen peroxide/sulfuric acid and the like can be used.

Figure 4D:
FIG. 4D is a cross-sectional view showing the process in another example of an embodiment of the invention.

As shown in FIG. 4D, after etching, the etching resist M is removed. The etching resist M can be removed by chemical or mechanical peeling.

Figure 4E:
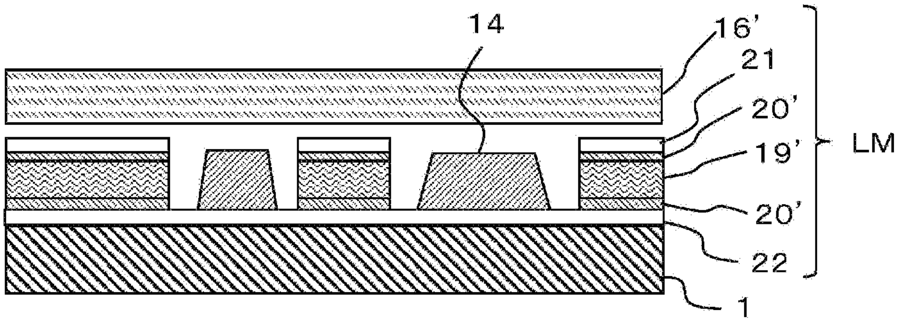
FIG. 4E is a cross-sectional view showing the process in another example of an embodiment of the invention.

Subsequently, as shown in FIG. 4E, while the opening of the wiring board WB or the wiring board material WB' is aligned at the position where the plurality of embedded members 14 is formed on the top surface of the support film 22, the wiring board WB or the wiring board material WB' is laminated to dispose the embedded members 14, and the filling sheet 16' is laminated to obtain a laminated material LM.

The subsequent step is the same as that of the above embodiment, and this makes it possible to obtain the wiring board WB including the embedded member 14 embedded in the wiring board WB, the wiring layer 23, and the insulating layer 19, the periphery of the embedded member 14 being bonded to the insulating layer 19 by the thermosetting resin 17 oozing out from the filling sheet 16'.

Figure 6A:
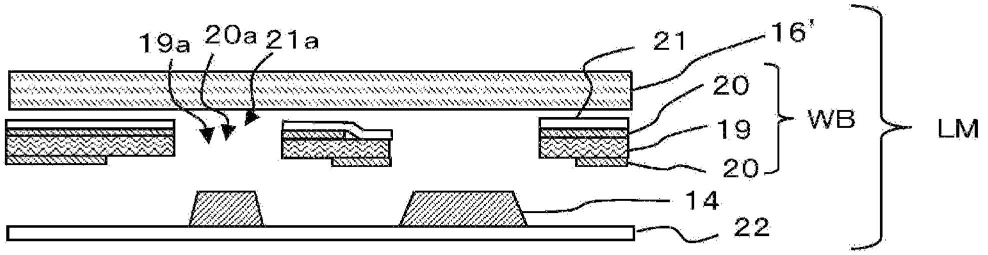
FIG. 6A is a cross-sectional view showing the process in another example of an embodiment of the invention.
Figure 6B:
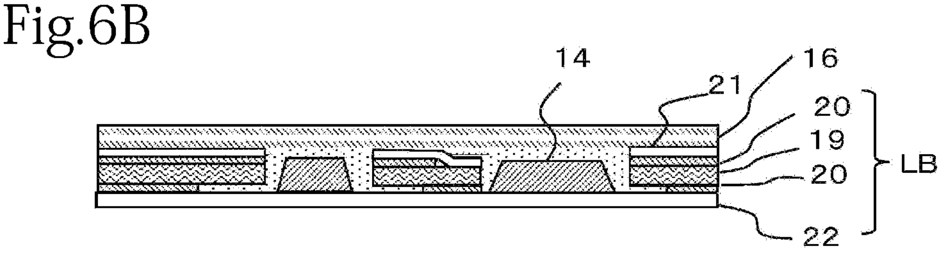
FIG. 6B is a cross-sectional view showing the process in another example of an embodiment of the invention.

(4) In the above-described embodiment, an example is shown, in which the wiring board and the like is manufactured by using the wiring board material WB' before forming the wiring pattern, but as shown in FIGS. 6A and 6B, it is also possible to use a wiring board WB having a wiring pattern 20 and an insulating layer 19. The illustrated example shows an example in which the resin film 21 is pasted to the top surface of the wiring board WB or the wiring board material WB', and the filling sheet 16' is laminated on the upper side thereof.

First, as shown in FIG. 6A, a laminated material LM including a support film 22 on which an embedded member 14 are formed, a wiring board WB having a plurality of openings 19*a* and 20*a* in portions corresponding to the embedded members 14, and a filling sheet 16' containing a thermosetting resin 17 is laminated such that the embedded member 14 is positioned in each of the openings 19*a* and 20*a*. At this time, it is preferable that the top surface of the wiring board WB is covered with the resin film 21, and it is more preferable that the resin film 21 has a plurality of openings 21*a* in portions corresponding to the embedded members 14.

Subsequently, as shown in FIG. 6B, performed is the step of integrating the laminated material LM by heating and pressing to obtain a laminated body LB including the thermosetting resin 17 filled between the inner surface of each of the openings 19*a* and 20*a* of the wiring board WB and each of the embedded members 14. This makes it possible to form the laminated body LB in which the height of each of the embedded members 14 is the same as or slightly lower than that of the top surface of the wiring board WB. Such a step can be performed in the same manner as in the above embodiment.

Figure 6C:
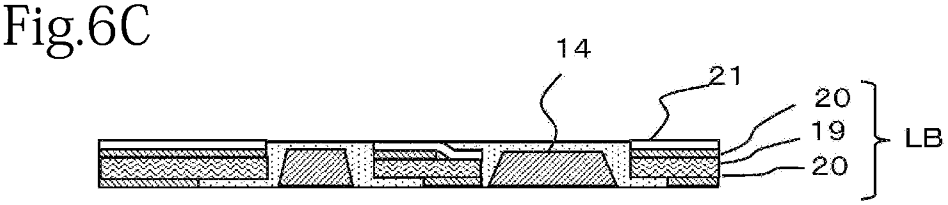
FIG. 6C is a cross-sectional view showing the process in another example of an embodiment of the invention.

Thereafter, as shown in FIG. 6C, in the same manner as in the above embodiment, performed is the step of removing the cured product 16 of the filling sheet 16' by grinding to obtain a constant thickness of the laminated body LB. In the present embodiment, an example is shown, in which, when the cured product 16 of the filling sheet 16' is removed, a part of the resin film 21 is removed. As a result, the entire cured product 16 is removed, and a part of the resin film 21 is removed. Of course, only the entire cured product 16 may be removed.

Figure 6D:
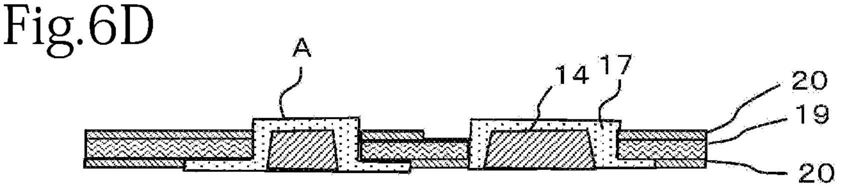
FIG. 6D is a cross-sectional view showing the process in another example of an embodiment of the invention.
Figure 6E:
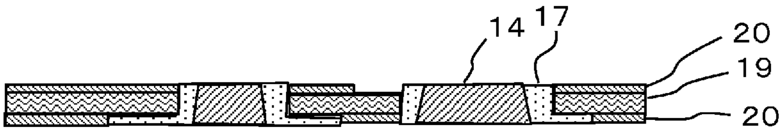
FIG. 6E is a cross-sectional view showing the process in another example of an embodiment of the invention.

Subsequently, as shown in FIGS. 6D to 6E, the resin film 21 on the top surface is peeled off, and the thermosetting resin (protrusion A) covering the top surface of the embedded member 14 is removed. When the top surface of each of the embedded members 14 is higher than the top surface of the wiring board WB, the embedded members 14 can also be removed by that rate as necessary.

This makes it possible to obtain the wiring board which includes an insulating layer 19, the embedded members 14 embedded in the insulating layer 19, and the wiring layer (wiring pattern 20). The insulating layer 19 includes the cured product 16 of the filling sheet 16', and the thermosetting resin 17 different from the resin component of the insulating layer 19 causes the periphery of each of the embedded members 14 to be bonded to the insulating layer 19.

A double-sided wiring board used as in the illustrated example preferably has an interlayer connection structure such as a plated through hole, a metal bump, a filled via, or a plated via.

In this embodiment, as shown in FIG. 6C, each step is performed after the support film 22 is peeled off from the laminated body LB, but the support film 22 may be peeled off after each step.

(5) In the above-described embodiment, an example is shown, in which the wiring layer of the wiring board WB to be used has a normal thickness, but in the present invention, it is also possible to use a wiring board WB having a thicker wiring layer (for example, a thickness of more than half of that of the insulating layer). It is also possible to employ a structure in which the embedded member 14 are connected in a pattern having the same thickness, or a structure in which a wiring pattern having the same thickness as that of each of the embedded member 14 is embedded in the insulating layer independently of the embedded member 14.

Figure 7A:
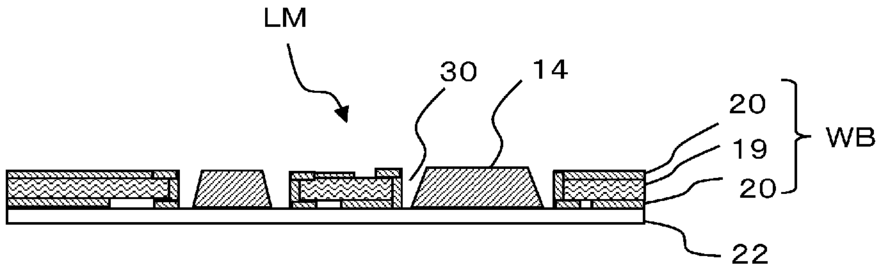
FIG. 7A is a cross-sectional view showing the process in another example of an embodiment of the invention.
Figure 7B:
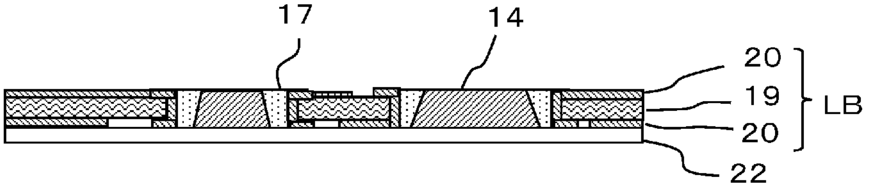
FIG. 7B is a cross-sectional view showing the process in another example of an embodiment of the invention.
Figure 7C:
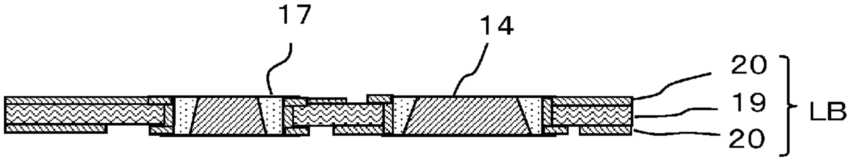
FIG. 7C is a cross-sectional view showing the process in another example of an embodiment of the invention.

(6) As the wiring substrate of the present invention, an example is shown, in which the plated through hole 30 is not formed in each of the openings of the wiring board WB or the wiring board material WB', but as shown in FIG. 7A-7C, the plated through hole 30 may be formed in each of the openings.

In that case, for example, as shown in FIG. 7A, performed is the step of preparing a laminate material LM including a support film 22 having an embedded member 14 formed thereon, and a wiring board WB or a wiring board material WB' having a plurality of openings in portions corresponding to the embedded members 14, and having a through hole 30 formed in each of the openings, wherein the embedded members 14 are positioned in the openings.

Subsequently, in the same manner as in the above embodiment, as shown in FIG. 7B, for example, performed is the step of obtaining laminated body LB, by filling and curing the thermosetting resin 17 between the inner surface of the plated through hole 30 in each of the openings of the wiring board WB or the wiring board material WB' and each of the embedded members 14.

In the illustrated example, the heights of the top and lower surfaces of each of the embedded members 14 coincide with the top and lower surfaces of the wiring board WB or the wiring board material WB'. Therefore, as shown in FIG. 7C, by merely peeling the support film 22 from the laminated body LB, a wiring board can be manufactured, which includes the wiring board WB having an opening, the embedded member 14 positioned in the opening, and a thermosetting resin 17 filled and cured between the inner surface of the opening and the embedded member 14.

The use of the wiring board WB or the wiring board material WB' having the plated through hole 30 formed therein makes it possible to manufacture the wiring board having the plated through hole formed in the opening.

(7) In the above-described embodiment, shown is an example using or manufacturing a double-sided wiring board in which the wiring board WB or the wiring board material WB' has two metal layers 20'. However, it is also possible to use or manufacture a single-sided wiring board having one metal layer 20' or a multilayer wiring board having three, four, five, six, or eight or more layers.

In the case of using the multilayer wiring board, a multilayer wiring board having the same number of layers can be manufactured, but for example, a multilayer wiring board having a larger number of layers than those of the used multilayer wiring board can also be manufactured by disposing a single-sided metal clad laminated board on the surface and heating and pressing the single-sided metal clad laminated board. In this case, an interlayer connection structure can be formed by pattern-forming a metal layer on the surface or forming a plated through hole or the like.

(8) In the above-described embodiment, an example is shown, in which a wiring board material having two metal layers 20' and an insulating layer 19' is used as the wiring board material WB'. However, it is also possible to manufacture a double-sided wiring board by using a wiring board material composed of only the insulating layer 19' as the wiring board material WB', embedding the embedded member 14 in the opening, and then providing a metal-plated layer 23' to form a pattern.

(9) In the above-described embodiment, shown is an example of forming the laminated body LB using the filling sheet 16' containing the thermosetting resin 17. However, a coating material containing the thermosetting resin 17 may be used to form the laminated body LB in which the cured product of the coating layer is integrated with the wiring board WB or the wiring board material WB'. The coating layer may be formed on the entire surface of the wiring board WB or the wiring board material WB', may be partially formed, or may be formed only in the opening portion of the wiring board WB or the wiring board material WB', or only in the opening portion and the periphery thereof.

As the coating material, any coating material containing the thermosetting resin 17 for forming the insulating layer of the wiring board can be used, but a coating material containing the same thermosetting resin as the thermosetting resin 17 contained in the filling sheet 16' is preferable. Any material included in the coating material for forming the insulating layer of the wiring board, such as a curing agent, a curing catalyst, a filler, or a solvent, can be used.

The method for forming the coating layer may be any of spraying, coating with a curtain coater or the like, and various printings with an inkjet printer or the like. Among them, from the viewpoint of efficient filling, coating with a curtain coater or the like is preferably used. When the coating layer is partially formed, screen printing or coating by squeegee is preferably used.

When applying coating material or filling the thermosetting resin 17, by reducing the atmospheric pressure, the thermosetting resin 17 can be more reliably filled in a gap between the inner surface of each of the openings and each of the embedded members 14. That is, even when voids or airspaces occur in the thermosetting resin 17 filled under a reduced pressure atmosphere, the voids and the airspaces can be reduced or eliminated by returning the reduced pressure atmosphere to the atmospheric pressure after filling.

The thermosetting resin 17 to be used may be cured at room temperature after filling (reactive curing type), but a thermosetting resin which is cured by heating may be used, and a heating and pressing step may be employed for curing. In the heating and pressing step, it is also possible to use a heating apparatus including a heater, and the like, as well as a hot press apparatus capable of applying pressure at the same time.

(10) In the above-described embodiment, an example is shown, in which a non-conductive thermosetting resin is filled at the time of obtaining the laminated body in which the thermosetting resin is filled between the inner surface of each of the openings of the wiring board or the wiring board material and each of the embedded members, but a conductive thermosetting resin may be filled. As described above, by filling the opening with the conductive thermosetting resin, the wiring layers of the wiring board or the wiring board material may be capable of being electrically connected.

In this case, a conductive coating layer may be partially provided, and it is preferable to form a conductive coating layer only in the opening portion of the wiring board WB or the wiring board material WB' or only in the opening portion and the periphery thereof.

As the conductive coating layer, a coating liquid containing a thermosetting resin and a conductive substance is used, and a conductive paste or a conductive ink or the like can be used. As the conductive material, a conductive material such as silver, copper, nickel, or carbon can be used.

Figure 8A:
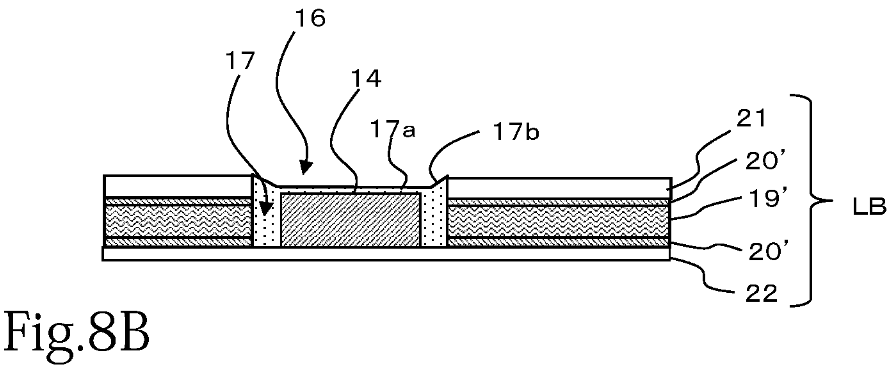
FIG. 8A is a cross-sectional view showing the process in another example of an embodiment of the invention.

(11) In the above-described embodiment, shown is an example of forming the laminated body LB using the filling sheet 16' containing the thermosetting resin 17. However, as shown in FIG. 8A, a coating material containing the thermosetting resin 17 may be used to form the laminated body LB in which the cured product 16 of the coating layer having a recess 17*a* above the embedded member 14 is integrated with the wiring board WB or the wiring board material WB'.

When the coating layer is formed only in the opening portion of the wiring board WB or the wiring board material WB' or only in the opening portion and the periphery thereof by various printing methods, the volume of the coating layer decreases due to the curing of the thermosetting resin 17 or the evaporation of the solvent, and therefore the cured product 16 of the coating layer having the recess 17*a* above the embedded member 14 can be formed. In the recess 17*a*, the thickness of the cured product 16 of the coating layer is smaller than that in the peripheral portion 17*b*, and therefore the cured product 16 of the coating layer in the recess 17*a* is easily removed in a later step.

As various printing methods, an ink jet printer, screen printing, and a squeegee and the like can be used, and in particular, it is effective to perform squeegee application using the resin film 21 having an opening as a mask material.

Figure 8B:
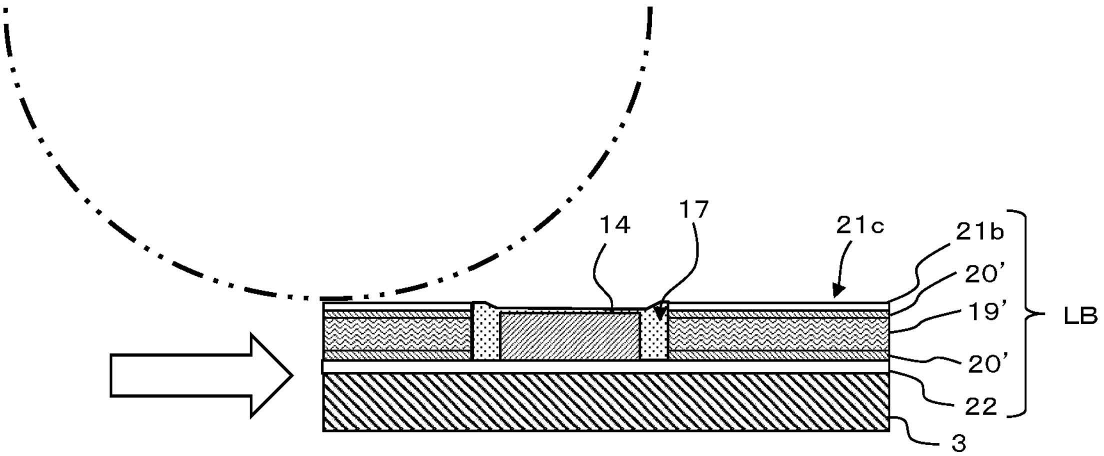
FIG. 8B is a cross-sectional view showing the process in another example of an embodiment of the invention.

Thereafter, for example, as shown in FIG. 8B, when the step of removing the cured product 16 of the coating layer by grinding to obtain a constant thickness of the laminated body LB is performed, the peripheral portion 17*b* of the cured product 16 of the coating layer and a part of the resin film 21 are removed. As a result, the height of the peripheral portion 17*b* of the cured product 16 of the coating layer decreases.

Figure 8C:
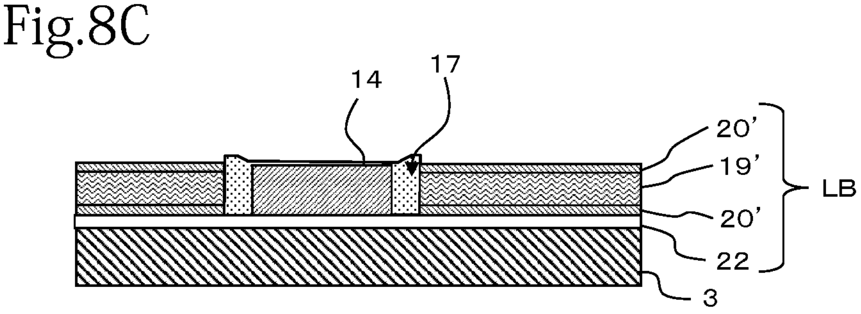
FIG. 8C is a cross-sectional view showing the process in another example of an embodiment of the invention.

Subsequently, as shown in FIG. 8C, when the remaining portion 21*b* of the resin film 21 is peeled off from the laminated body LB, the cured product 16 of the coating layer slightly higher than the top surface of the wiring board WB or the wiring board material WB' is formed.

Figure 8D:
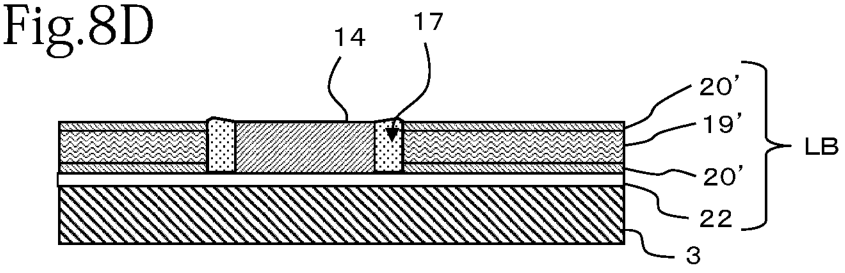
FIG. 8D is a cross-sectional view showing the process in another example of an embodiment of the invention.

When the height of the cured product 16 of the coating layer is small as described above, as shown in FIG. 8D, the cured product 16 of the coating layer on the top surface of the embedded member 14 can be removed by polishing such as buffing or sandblasting. At that time, the cured product 16 of the coating layer of the peripheral portion 17*b* is also removed to some extent, and therefore the thermosetting resin 17 can be filled in a state where the top surface is almost flat.

DESCRIPTION OF REFERENCE SIGNS

14 Embedded member
16 Cured product of filling sheet
16' Filling sheet
17 Thermosetting resin
19 Insulating layer
19' Insulating layer (wiring board material)
19*a* Opening
20 Wiring pattern
20' Metal layer (wiring board material)
20*a* Opening
21 Resin film
21*a* Opening
22 Support film
23 Wiring layer
23' Metal-plated layer
30 Plated through hole
A Protrusion
WB Wiring board
WB' Wiring board material
LM Laminated material
LB Laminated body

The invention claimed is:

1. A method for manufacturing a wiring board or a wiring board material, comprising the steps of:

obtaining a laminated body including the wiring board or the wiring board material having an opening, an embedded member positioned in the opening, a cured product of a filling sheet that is integrated with the wiring board or the wiring board material, is laminated on top of the embedded member, and contains a thermosetting resin, the thermosetting resin being filled and cured between an inner surface of the opening of the wiring board or the wiring board material and the embedded member, and a resin film having an opening at a position corresponding to the opening of the wiring board or the wiring board material, the resin film is attached to the wiring board or the wiring board material;

removing the cured product of the filling sheet on the resin film by grinding from a top of the cured product of the filling sheet to obtain a constant thickness of the laminated body so that a part of the resin film is removed;

peeling a remaining part of the resin film from the laminated body, leaving the cured thermosetting resin covering the embedded member, and forming a protrusion made of the cured thermosetting resin; and then removing the cured thermosetting resin covering the embedded member of the laminated body, removing an upper protrusion of the embedded member, exposing an upper surface of the embedded member, and flattening a top surface of the laminated body.

2. The method for manufacturing a wiring board or a wiring board material according to claim 1, the step of obtaining the laminated body includes steps of:

preparing a laminated material including the wiring board or the wiring board material, the embedded member, and the filling sheet; and integrating the laminated material by heating and pressing to obtain the laminated body.

3. The method for manufacturing a wiring board or a wiring board material according to claim 1, wherein the laminated body includes a support film different from the filling sheet, and the support film is attached to a lower surface of the wiring board or the wiring board material, the method further comprising peeling the support film from the laminated body.

4. The method for manufacturing a wiring board or a wiring board material according to claim 1, wherein the filling sheet is a prepreg containing the thermosetting resin and a reinforcing fiber.

5. The method for manufacturing a wiring board or a wiring board material according to claim 1, in the step of obtaining the laminated body, the embedded member is disposed in the opening of the wiring board or the wiring board material by applying vibration.

6. The method for manufacturing a wiring board or a wiring board material according to claim 1, wherein the embedded member is one or more selected from metal, ferrite, ceramic, a resistor, and a capacitor.

7. A method for manufacturing a wiring board or a wiring board material, comprising the steps of:

obtaining a laminated body including the wiring board or the wiring board material having an opening, an embedded member positioned in the opening, a cured product of a coating layer that is integrated with the wiring board or the wiring board material, is laminated on top of the embedded member, and contains a thermosetting resin, the thermosetting resin being filled and cured between an inner surface of the opening of the wiring board or the wiring board material and the embedded member, and a resin film having an opening at a position corresponding to the opening of the wiring board or the wiring board material, the resin film is attached to the wiring board or the wiring board material;

removing the cured product of the coating layer on the resin film by grinding from a top of the cured product of the coating layer to obtain a constant thickness of the laminated body so that a part of the resin film is removed;

peeling a remaining part of the resin film from the laminated body, leaving the thermosetting resin covering the embedded member, and forming a protrusion made of the thermosetting resin; and then removing the cured thermosetting resin covering the embedded member of the laminated body, removing an upper protrusion of the embedded member, exposing an upper surface of the embedded member, and flattening a top surface of the laminated body.

8. The method for manufacturing a wiring board or a wiring board material according to claim 7, the step of obtaining the laminated body includes steps of:

preparing a laminated material including the wiring board or the wiring board material, the embedded member, and the coating layer; and integrating the laminated material by heating and pressing to obtain the laminated body.

9. The method for manufacturing a wiring board or a wiring board material according to claim 7, wherein the laminated body includes a support film different from the coating layer, and the support film is attached to a lower surface of the wiring board or the wiring board material, the method further comprising peeling the support film from the laminated body.

10. The method for manufacturing a wiring board or a wiring board material according to claim 7, in the step of obtaining the laminated body, the embedded member is disposed in the opening of the wiring board or the wiring board material by applying vibration.

11. The method for manufacturing a wiring board or a wiring board material according to claim 7, wherein the embedded member is one or more selected from metal, ferrite, ceramic, a resistor, and a capacitor.

* * * * *